(12) United States Patent  
Ojima et al.

(10) Patent No.: US 12,476,610 B2  
(45) Date of Patent: Nov. 18, 2025

(54) PIEZOELECTRIC VIBRATOR AND MANUFACTURING METHOD THEREFOR

(71) Applicant: Murata Manufacturing Co., Ltd., Nagaokakyo (JP)

(72) Inventors: Shigeo Ojima, Nagaokakyo (JP); Masaki Ushiro, Nagaokakayo (JP); Hiroyuki Yamamoto, Nagaokakayo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 967 days.

(21) Appl. No.: 17/586,950

(22) Filed: Jan. 28, 2022

(65) Prior Publication Data

US 2022/0158618 A1     May 19, 2022

Related U.S. Application Data

(63) Continuation of application No. PCT/JP2020/033244, filed on Sep. 2, 2020.

(30) Foreign Application Priority Data

Sep. 4, 2019   (JP) .................................. 2019-161537

(51) Int. Cl.
    *H03H 9/19*      (2006.01)
    *H03H 3/02*      (2006.01)
    *H03H 9/10*      (2006.01)

(52) U.S. Cl.
    CPC ................. *H03H 9/19* (2013.01); *H03H 3/02* (2013.01); *H03H 9/10* (2013.01)

(58) Field of Classification Search
    CPC .......... H03H 9/10; H03H 9/19; H03H 9/0519; H03H 9/131; H03H 9/1021
    See application file for complete search history.

(56) References Cited

U.S. PATENT DOCUMENTS 10,454,020 B2 *   10/2019   Gamo .................... H03H 9/177  
2015/0171821 A1 *   6/2015   Ishii ........................ H03H 9/17  
                                                                                                                                                           310/321

FOREIGN PATENT DOCUMENTS

JP      2003078383 A    3/2003  
JP      2005269628 A    9/2005  
(Continued)

OTHER PUBLICATIONS

International Search Report issued in PCT/JP2020/033244, dated Nov. 10, 2020.

(Continued)

*Primary Examiner* — J. San Martin  
(74) *Attorney, Agent, or Firm* — ArentFox Schiff LLP

(57) ABSTRACT

A crystal vibrator that includes a crystal vibration element having a crystal piece and a pair of electrodes that face each other with the crystal piece interposed therebetween; and a holder that accommodates the crystal vibration element. At least one electrode of the pair of electrodes includes an upper layer containing gold and a lower layer between the crystal piece and the upper layer and containing chromium. A surface of the at least one electrode contains a plurality of crystal grains composed of gold and a chromium compound along grain boundaries between the plurality of crystal grains. An area percentage of the plurality of crystal grains is equal to or more than 35% and equal to or less than 60% when the surface of the at least one electrode is viewed in a plan view thereof.

7 Claims, 15 Drawing Sheets

(56) References Cited

FOREIGN PATENT DOCUMENTS

| | | |
|---|---|---|
| JP | 2006050508 A | 2/2006 |
| JP | 2006311337 A | 11/2006 |
| JP | 2011160095 A | 8/2011 |
| JP | 2014200042 A | 10/2014 |
| JP | 2016054363 A | 4/2016 |
| JP | 2016144091 A | 8/2016 |
| WO | WO-2018212188 A1 * 11/2018 | ............. H03H 9/215 |

OTHER PUBLICATIONS

Written Opinion of the International Searching Authority issued for PCT/JP2020/033244, dated Nov. 10, 2020.

* cited by examiner

FIG. 12

| INITIAL TEMPERATURE | AREA PERCENTAGE (%) | AVERAGE |
|---|---|---|
| 20°C_n=1 | 30.2 | 31.2 |
| 20°C_n=2 | 32.2 | |
| 100°C_n=1 | 38.6 | 40.5 |
| 100°C_n=2 | 42.3 | |
| 150°C_n=1 | 42.1 | 44.7 |
| 150°C_n=2 | 43.2 | |
| 150°C_n=3 | 46.9 | |
| 150°C_n=4 | 46.4 | |
| 200°C_n=1 | 42.6 | 45.1 |
| 200°C_n=2 | 43.6 | |
| 200°C_n=3 | 46.9 | |
| 200°C_n=4 | 47.4 | |
| 250°C_n=1 | 47.2 | 45.8 |
| 250°C_n=2 | 44.6 | |
| 250°C_n=3 | 45.7 | |
| 250°C_n=4 | 45.7 | |

FIG. 14

| SAMPLE | C | O | Si | Cr | Au | Sum | Cr/Au |
|---|---|---|---|---|---|---|---|
| INITIAL TEMPERATURE 20°C_n=1 | 28.4 | 36.4 | 6.7 | 10.1 | 18.5 | 100.0 | 0.55 |
| INITIAL TEMPERATURE 20°C_n=2 | 27.8 | 38.1 | 6.7 | 10.7 | 16.9 | 100.0 | 0.63 |
| INITIAL TEMPERATURE 100°C_n=1 | 28.9 | 33.4 | 7.4 | 8.3 | 22.0 | 100.0 | 0.38 |
| INITIAL TEMPERATURE 100°C_n=2 | 28.5 | 33.7 | 7.4 | 8.7 | 21.7 | 100.0 | 0.40 |
| INITIAL TEMPERATURE 200°C_n=1 | 27.9 | 33.5 | 7.3 | 8.2 | 23.1 | 100.0 | 0.35 |
| INITIAL TEMPERATURE 200°C_n=2 | 28.8 | 32.3 | 7.4 | 7.7 | 23.9 | 100.0 | 0.32 |
| INITIAL TEMPERATURE 250°C_n=1 | 29.2 | 31.7 | 7.5 | 7.4 | 24.2 | 100.0 | 0.31 |
| INITIAL TEMPERATURE 250°C_n=2 | 30.0 | 31.7 | 6.9 | 7.4 | 24.0 | 100.0 | 0.31 |

PIEZOELECTRIC VIBRATOR AND MANUFACTURING METHOD THEREFOR

CROSS REFERENCE TO RELATED APPLICATIONS

The present application is a continuation of International application No. PCT/JP2020/033244, filed Sep. 2, 2020, which claims priority to Japanese Patent Application No. 2019-161537, filed Sep. 4, 2019, the entire contents of each of which are incorporated herein by reference.

FIELD OF THE INVENTION

The present invention relates to a piezoelectric vibrator and a manufacturing method therefor.

BACKGROUND OF THE INVENTION

Vibrators are used as timing devices, sensors, oscillators, and so on in various electronic appliances such as mobile communication terminals, communication base stations, home appliances, and so forth. For example, a piezoelectric vibrator consists of a piezoelectric vibration element, which includes a mechanical vibration part that converts electrical vibrations into mechanical vibrations using the piezoelectric effect, a holder that accommodates the piezoelectric vibration element, and an electrically conductive holding member that electrically connects the piezoelectric vibration element and the holder to each other. The electrically conductive holding member is composed of, for example, a cured electrically conductive adhesive having silicone resin as a main component.

Patent Document 1 discloses a method for manufacturing a vibrator having improved frequency stability. The vibrator includes an excitation electrode having a base layer composed of chromium and an upper layer composed of gold. The method includes a step of mounting a vibration piece on a substrate using a bonding material, a step of performing a heat treatment on the bonding material and the vibration piece at a first temperature, a step of adjusting the frequency of the vibration piece after the step of performing the heat treatment at the first temperature, and a step of performing a heat treatment on the bonding material and the vibration piece at a second temperature after the step of adjusting the frequency. The second temperature is lower than the first temperature and the difference between the first temperature and the second temperature is greater than or equal to 15° C.

Patent Document 2 discloses an excitation electrode structure for a crystal vibrator that can significantly improve changes that occur over time in the electrical characteristics of the crystal vibrator. In the excitation electrode structure, a titanium layer serving as a base electrode and a main electrode layer composed of a gold (Au) layer provided on the base electrode are stacked on a crystal substrate of the crystal vibrator. The grain size of the main electrode layer is from 0.01 μm to 0.1 μm. In addition, the crystal substrate temperature during deposition of the gold layer that forms the main electrode layer is set to lie within a range from room temperature (25° C.±3° C.) to 50° C. rather than 120° C.±10° C. as has been used in the past. Consequently, the grain size of the gold layer is small and the electrode surface is dense. The grain size is from 0.01 μm to 0.1 μm.

Patent Document 3 discloses that factors such as adsorption and desorption of gas molecules to and from the crystal piece, oxidation of the vapor deposited electrode, recrystallization of the vapor deposited electrode, and diffusion of electrode metal and other substances into the crystal piece are responsible for changes that occur over time in the characteristics of a crystal vibrator.

Patent Document 1: Japanese Unexamined Patent Application Publication No. 2016-144091

Patent Document 2: Japanese Unexamined Patent Application Publication No. 2006-311337

Patent Document 3: Japanese Unexamined Patent Application Publication No. 2006-50508

SUMMARY OF THE INVENTION

However, in the manufacturing method disclosed in Patent Document 1, even if the heat treatment performed on the excitation electrode is optimized so that chromium does not diffuse after ion milling is performed to adjust the frequency, chromium will diffuse into the upper layer again during a subsequent heating process, such as a reflow process, resulting in a chromium oxide layer being formed on the surface of the upper layer. As a result, frequency fluctuations will occur.

Furthermore, it is understood that the grain size of gold deposited in a vapor deposition method becomes smaller and the change in frequency over time becomes larger at the vapor deposition temperatures described in Patent Document 2.

In addition, although Patent Document 3 discloses factors responsible for changes that occur in characteristics over time, no countermeasures are suggested.

The present invention was made in light of the above-described circumstances and it is an object of the present invention to provide a piezoelectric vibrator having improved frequency stability and a manufacturing method therefor.

A piezoelectric vibrator according to an aspect of the present invention includes: a piezoelectric vibration element that includes a piezoelectric piece and a pair of electrodes that face each other with the piezoelectric piece interposed therebetween; and a holder that accommodates the piezoelectric vibration element. At least one electrode of the pair of electrodes includes an upper layer containing gold and a lower layer between piezoelectric piece and the upper layer and containing chromium. A surface of the at least one electrode contains a plurality of crystal grains composed of gold and a chromium compound along grain boundaries between the plurality of crystal grains. An area percentage of the plurality of crystal grains is equal to or more than 35% and equal to or less than 60% when the surface of the at least one electrode is viewed in a plan view thereof.

A piezoelectric vibrator manufacturing method according to another aspect of the present invention includes preparing a piezoelectric vibration element by: preheating a piezoelectric piece at a temperature equal to or higher than 100° C. and equal to or lower than 300° C., providing lower layers containing chromium on opposed surfaces of the preheated piezoelectric piece, and providing upper layers containing gold on the lower layers so as to form a pair of electrodes that face each other with the piezoelectric piece interposed therebetween; mounting the piezoelectric vibration element on a base member using an electrically conductive holding member; and bonding a cover member to the base member using a bonding member.

According to the present invention, a piezoelectric vibrator having improved frequency stability and a manufacturing method therefor can be provided.

BRIEF DESCRIPTION OF THE DRAWINGS

FIG. 12 is a table illustrating the area percentages of a plurality of crystal grains.

FIG. 14 illustrates a table illustrating the atomic composition of the surface of the first excitation electrode.

DETAILED DESCRIPTION OF THE PREFERRED EMBODIMENTS

Figure 1:
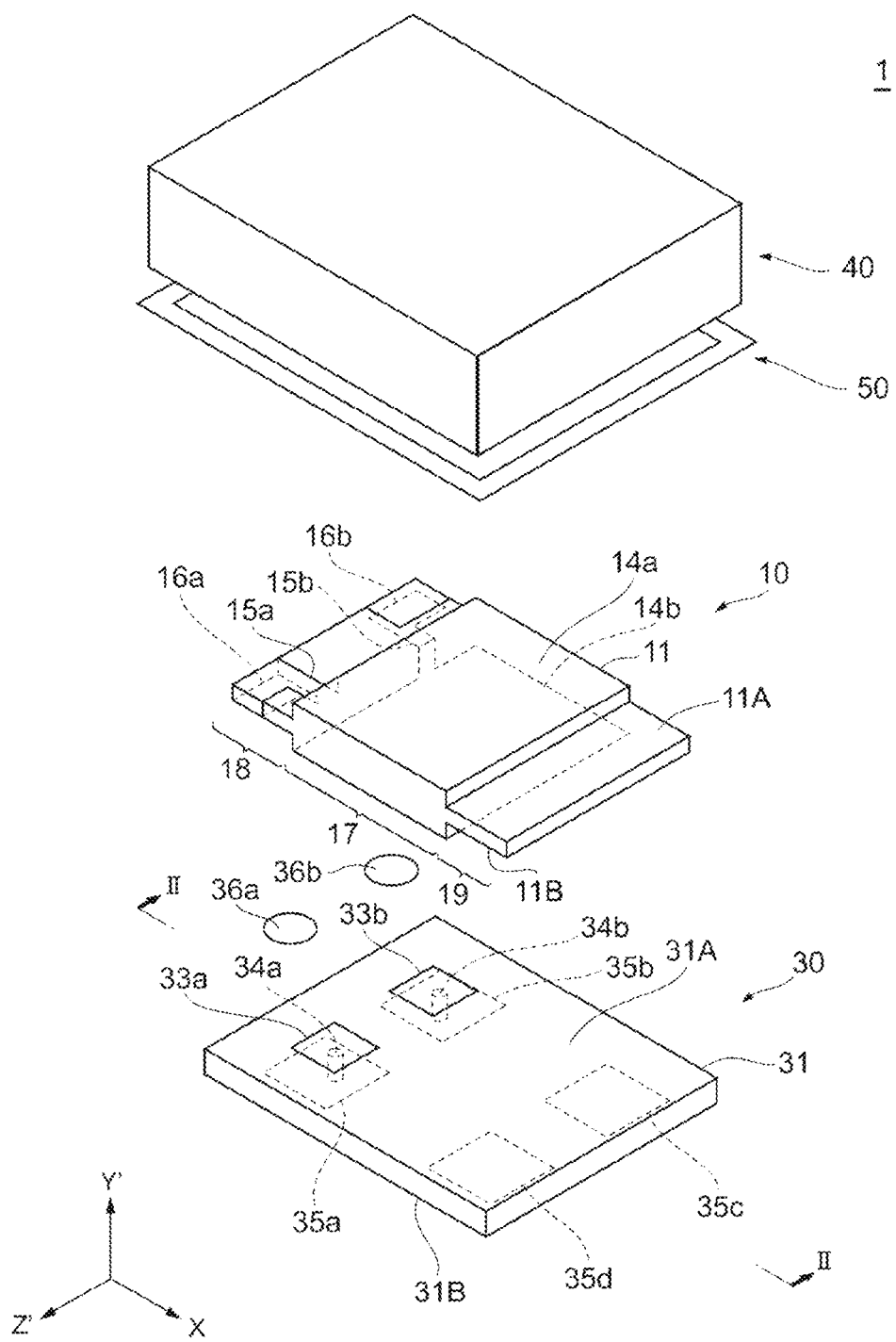
FIG. 1 is an exploded perspective view schematically illustrating the configuration of a crystal vibrator according to a First Embodiment.

Hereafter, embodiments of the present invention will be described while referring to the drawings. The drawings for each embodiment are representative, the dimensions and shapes of the individual parts are schematically illustrated, and the technical scope of the invention of the present application should not be interpreted as being limited to that of the embodiments.

First Embodiment

Figure 2:
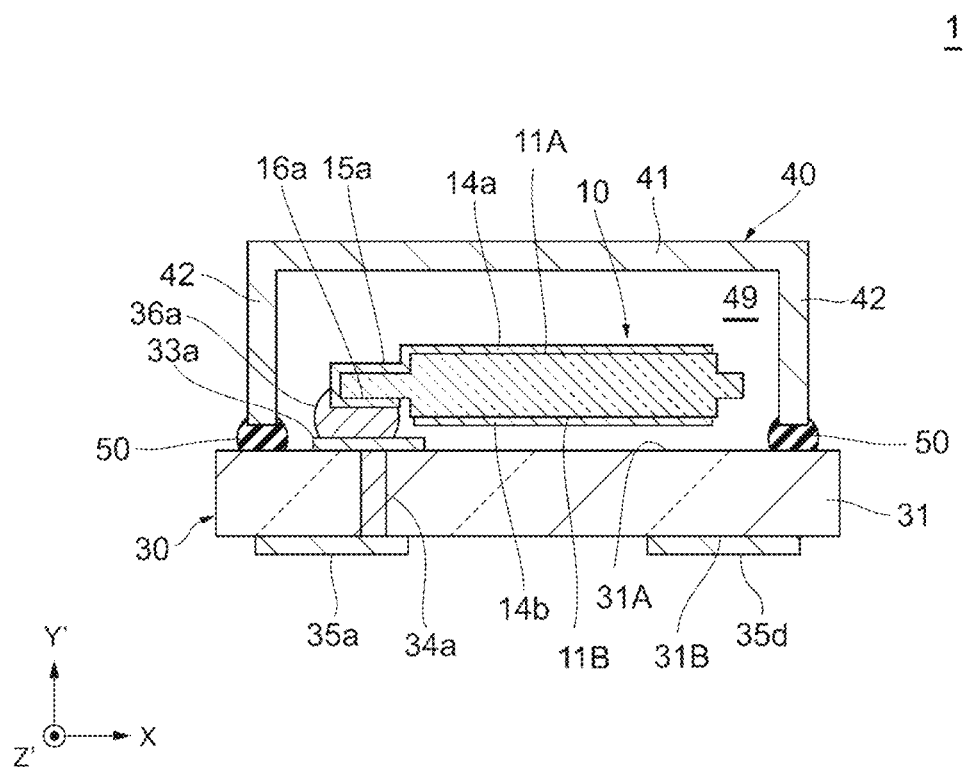
FIG. 2 is a sectional view schematically illustrating the configuration of the crystal vibrator according to the First Embodiment.

The configuration of a crystal vibrator 1 according to a First Embodiment of the present invention will be described while referring to FIGS. 1 and 2. FIG. 1 is an exploded perspective view schematically illustrating the configuration of the crystal vibrator according to the First Embodiment. FIG. 2 is a sectional view schematically illustrating the configuration of the crystal vibrator according to the First Embodiment.

For convenience, each drawing may be labeled with a Cartesian coordinate system consisting of an X axis, a Y' axis, and a Z' axis in order to help clarify the relationships between the individual drawings and to aid in understanding the positional relationships between the individual components. The X axis, the Y' axis, and the Z' axis correspond to one another in the individual drawings. The X axis, the Y' axis, and the Z' axis respectively correspond to the crystallographic axes of a crystal piece 11, which is described later. The X axis corresponds to an electrical axis (polarity axis), a Y axis corresponds to a mechanical axis, and a Z axis corresponds to an optical axis. The Y' axis and the Z' axis are axes obtained by respectively rotating the Y axis and the Z axis around the X axis in a direction from the Y axis towards the Z axis by 35 degrees 15 minutes±1 minute 30 seconds.

In the following description, a direction parallel to the X axis is referred to as an "X axis direction", a direction parallel to the Y' axis is referred to as a "Y' axis direction", and a direction parallel to the Z' axis is referred to as a "Z' axis direction". In addition, the directions of the tips of the arrows of the X axis, Y' axis, and Z' axis are referred to as "+(plus)" directions and the directions opposite to these directions are referred to as "−(minus)" directions. For convenience, the +Y' axis direction is described as being an upward direction and the −Y' axis direction is described as being a downward direction, but the vertical orientation of the crystal vibrator 1 is not restricted. For example, in the following description, a +Y' axis direction side and a −Y' axis direction side of a crystal vibration element 10 are respectively referred to as an upper surface 11A and a lower surface 11B, but the crystal piece 11 may be disposed so that the upper surface 11A is located vertically below the lower surface 11B.

The crystal vibrator 1 includes the crystal vibration element 10, a base member 30, a cover member 40, and a bonding member 50. The crystal vibration element 10 is provided between the base member 30 and the cover member 40. The base member 30 and the cover member 40 form a holder that is for accommodating the crystal vibration element 10. In the example illustrated in FIGS. 1 and 2, the base member 30 is shaped like a flat plate and the cover member 40 has a bottomed cavity, which is for accommodating the crystal vibration element 10, on the side thereof near the base member 30. The crystal vibration element 10 is mounted on the base member 30. The shapes of the base member 30 and the cover member 40 are not limited to the above-described shapes so long as at least the part of the crystal vibration element 10 that is to be excited is accommodated in the holder. In addition, the method of holding the crystal vibration element 10 is not limited to the above-described method. For example, the base member 30 may have a bottomed cavity for accommodating the crystal vibration element 10 on the side thereof near the cover member 40. In addition, the base member 30 and the cover member 40 may sandwich therebetween the periphery of the part of the crystal vibration element 10 that is to be excited.

First, the crystal vibration element 10 will be described. The crystal vibration element 10 is an element in which a crystal is made to vibrate using the piezoelectric effect and that performs conversion between electrical energy and mechanical energy. The crystal vibration element 10 includes the flake-like crystal piece 11, a first excitation electrode 14a and a second excitation electrode 14b that form a pair of excitation electrodes, a first lead-out electrode 15a and a second lead-out electrode 15b that form a pair of lead-out electrodes, and a first connection electrode 16a and a second connection electrode 16b that form a pair of connection electrodes.

The crystal piece 11 has the upper surface 11A and the lower surface 11B, which face each other. The upper surface 11A is located on the opposite side from the side that faces the base member 30, i.e., on the side that faces a top surface part 41 of the cover member 40, which is described later. The lower surface 11B is located on the side that faces the base member 30.

The crystal piece 11 is, for example, an AT-cut crystal piece. The AT-cut crystal piece 11 is formed so that, in the Cartesian coordinate system consisting of the intersecting X axis, Y' axis, and Z' axis, a surface parallel to a plane defined by the X axis and the Z' axis (Hereafter, referred to as an "XZ' plane". Applies in a similar manner for planes defined by other axes.) is a main surface and a direction parallel to the Y' axis is a thickness direction. For example, the AT-cut crystal piece 11 is formed by etching a crystal substrate (for example, a crystal wafer) obtained by cutting and grinding down a synthetic quartz crystal.

The crystal vibration element 10 employing the AT-cut crystal piece 11 has high frequency stability over a wide range of temperatures. In the AT-cut crystal vibration element 10, a thickness shear vibration mode is used as a main vibration. The angle of rotation of the Y' axis and the Z' axis in the AT-cut crystal piece 11 may be set so that the axes are tilted from 35 degrees 15 minutes to equal to or more than −5 degrees and equal to or less than 15 degrees. A cut other than an AT cut may be used for the cut angle of the crystal piece 11. For example, a BT cut, a GT cut, a SC cut, and so on may be used. Furthermore, the crystal vibration element may be a tuning-fork-type crystal vibration element employing a crystal piece having a cut angle called a Z-plate.

The AT-cut crystal piece 11 has a long side direction in which long sides thereof that are parallel to the X axis direction extend, a short side direction in which short sides thereof that are parallel to the Z' axis direction extend, and a thickness direction in which a thickness dimension thereof that is parallel to the Y' axis direction extends. The crystal piece 11 has a rectangular shape when the upper surface 11A is seen in a plan view, and the crystal piece 11 includes an excitation part 17 that is located in the center and contributes to excitation and peripheral parts 18 and 19 that are adjacent to the excitation part 17. The excitation part 17 and the peripheral parts 18 and 19 are each formed in a strip shape across the entire width of the crystal piece 11 along the Z' axis direction. The peripheral part 18 is located on the −X axis direction side of the excitation part 17 and the peripheral part 19 is located on the +X axis direction side of the excitation part 17.

Note that the planar shape of the crystal piece 11 when the upper surface 11A is seen in the plan view is not limited to a rectangular shape. The planar shape of the crystal piece 11 may instead be a polygonal shape, a circular shape, an elliptical shape, or a combination of these shapes. The planar shape of the crystal piece 11 may be a tuning fork shape. In other words, the crystal piece 11 may include a base part and vibration arm parts that extend in parallel from the base part. A slit may be formed in the crystal piece 11 with the aim of suppressing leakage of vibrations and propagation of stress. The shapes of the excitation part 17 and the peripheral parts 18 and 19 of the crystal piece 11 are also not limited to strip-like shapes that extend across the entire width. For example, the planar shape of the excitation part may be an island-like shape that is adjacent to a peripheral part in the Z' axis direction and the planar shape of the peripheral part may be formed in a frame-like shape that surrounds the excitation part.

The crystal piece 11 has a so-called mesa structure in which the thickness of the excitation part 17 is larger than the thickness of the peripheral parts 18 and 19. In the crystal piece 11 having a mesa structure, leakage of vibrations from the excitation part 17 can be suppressed. The crystal piece 11 has a double-sided mesa structure and the excitation part 17 protrudes beyond the peripheral parts 18 and 19 on both the upper surface 11A side and the lower surface 11B side. The boundary between the excitation part 17 and the peripheral part 18 and the boundary between the excitation part 17 and the peripheral part 19 have tapered shapes in which the thickness changes in a continuous manner, but may instead have stepped shapes in which the thickness changes in a non-continuous manner. The boundaries may have a convex shape in which the change in thickness varies in a continuous manner or may have a bevel shape in which the change in thickness varies in a non-continuous manner. The crystal piece 11 may have a one-sided mesa structure in which the excitation part 17 protrudes beyond the peripheral parts 18 and 19 on only the upper surface 11A side or the lower surface 11B side. In addition, the crystal piece 11 may have a so-called reverse mesa structure in which the thickness of the excitation part 17 is smaller than the thickness of the peripheral parts 18 and 19.

The first excitation electrode 14a and the second excitation electrode 14b are provided on the excitation part 17. The first excitation electrode 14a is provided on the upper surface 11A side of the crystal piece 11 and the second excitation electrode 14b is provided on the lower surface 11B side of the crystal piece 11. In other words, the first excitation electrode 14a is provided on the main surface of the crystal piece 11 that is located on the side near the cover member 40 and the second excitation electrode 14b is provided on the main surface of the crystal piece 11 that is located on the side near the base member 30. The first excitation electrode 14a and the second excitation electrode 14b face each other with the crystal piece 11 interposed therebetween. When the upper surface 11A of the crystal piece 11 is seen in a plan view thereof, the first excitation electrode 14a and the second excitation electrode 14b have rectangular shapes and are disposed so as to substantially entirely overlap each other. The first excitation electrode 14a and the second excitation electrode 14b are formed in strip-like shapes across the entire width of the crystal piece 11 along the Z' axis direction. The first excitation electrode 14a and the second excitation electrode 14b correspond to a pair of electrodes, which includes electrodes that face each other with the crystal piece 11 interposed therebetween.

The planar shapes of the first excitation electrode 14a and the second excitation electrode 14b when the upper surface 11A of the crystal piece 11 is seen in the plan view are not limited to rectangular shapes. The planar shapes of the first excitation electrode 14a and the second excitation electrode 14b may instead be polygonal shapes, circular shapes, elliptical shapes, or a combination of these shapes.

The first lead-out electrode 15a and the second lead-out electrode 15b are provided on the peripheral part 18. The first lead-out electrode 15a is provided on the upper surface 11A side of the crystal piece 11 and the second lead-out electrode 15b is provided on the lower surface 11B side of the crystal piece 11. The first lead-out electrode 15a electrically connects the first excitation electrode 14a and the first connection electrode 16a to each other. The second lead-out electrode 15b electrically connects the second excitation electrode 14b and the second connection electrode 16b to each other. For example, as illustrated in FIG. 1, one end of the first lead-out electrode 15a is connected to the first excitation electrode 14a on the excitation part 17 and the other end of the first lead-out electrode 15a is connected to the first connection electrode 16a on the peripheral part 18. In addition, one end of the second lead-out electrode 15b is connected to the second excitation electrode 14b on the excitation part 17 and the other end of the second lead-out electrode 15b is connected to the second connection electrode 16b on the peripheral part 18. The first lead-out electrode 15a and the second lead-out electrode 15b are preferably separated from each other when the upper surface 11A of the crystal piece 11 is seen in the plan view in order to reduce stray capacitances. For example, the first lead-out electrode 15a is provided on the +Z' axis direction side when looking from the second lead-out electrode 15b.

The first connection electrode 16a and the second connection electrode 16b are electrodes for respectively connecting the first excitation electrode 14a and the second excitation electrode 14b to the base member 30, and are provided on the lower surface 11B side of the crystal piece 11 in the peripheral part 18. The first connection electrode 16a is provided at a corner formed between an edge of the crystal piece 11 on the −X axis direction side and an edge of the crystal piece 11 on the +Z' axis direction side and the second connection electrode 16b is provided at a corner formed between an edge of the crystal piece 11 on the −X axis direction side and an edge of the crystal piece 11 on the −Z' axis direction side.

Next, the base member 30 will be described.

The base member 30 holds the crystal vibrating element 10 in such a manner that the crystal vibration element 10 can be excited. The base member 30 includes a base 31 having an upper surface 31A and a lower surface 31B, which face each other. The upper surface 31A is located on the side near the crystal vibration element 10 and the cover member 40 and corresponds to a mounting surface on which the crystal vibration element 10 is mounted. The lower surface 31B corresponds to a mounting surface that will face a circuit board when the crystal vibrator 1 is mounted on an external circuit board, for example. The base 31 consists of a sintered material such as an insulating ceramic (alumina). The base 31 is preferably formed of a heat-resistant material from the viewpoint of suppressing generation of thermal stress. From the viewpoint of suppressing stress acting on the crystal vibration element 10 due to thermal history, the base 31 may be formed of a material having a coefficient of thermal expansion close to that of the crystal piece 11 and, for example, may be formed of a crystal.

The base member 30 includes a first electrode pad 33a and a second electrode pad 33b, which form a pair of electrode pads. The first electrode pad 33a and the second electrode pad 33b are provided on the upper surface 31A of the base 31. The first electrode pad 33a and the second electrode pad 33b are terminals for electrically connecting the crystal vibration element 10 to the base member 30. From the viewpoint of suppressing degradation of reliability due to oxidation, the outermost surfaces of the first electrode pad 33a and the second electrode pad 33b desirably contain gold and more desirably are substantially composed of only gold. For example, the first electrode pad 33a and the second electrode pad 33b may each have a two-layer structure consisting of a base layer that improves adhesion with the base 31 and a surface layer that contains gold and suppresses oxidation.

The base member 30 includes a first outer electrode 35a, a second outer electrode 35b, a third outer electrode 35c, and a fourth outer electrode 35d. The first to fourth outer electrodes 35a to 35d are provided on the lower surface 31B of the base 31. The first outer electrode 35a and the second outer electrode 35b are terminals for electrically connecting an external substrate, which is not illustrated, and the crystal vibrator 1 to each other. The third outer electrode 35c and the fourth outer electrode 35d are dummy electrodes to or from which no electrical signals or the like are input or output, but the third outer electrode 35c and the fourth outer electrode 35d may instead be ground electrodes that ground the cover member 40 and thereby improve an electromagnetic shielding function of the cover member 40. Note that the third outer electrode 35c and the fourth outer electrode 35d may instead be omitted.

The first electrode pad 33a and the second electrode pad 33b are disposed in a line along the Z' axis direction on an end portion of the base member 30 that is on the −X axis direction side. The first outer electrode 35a and the second outer electrode 35b are disposed in a line along the Z' axis direction on an end portion of the base member 30 that is on the −X axis direction side. The third outer electrode 35c and the fourth outer electrode 35d are disposed in a line along the Z' axis direction on an end portion of the base member 30 that is on the +X axis direction side. The first electrode pad 33a is electrically connected to the first outer electrode 35a via a first through electrode 34a that penetrates through the base 31 in the Y' axis direction. The second electrode pad 33b is electrically connected to the second outer electrode 35b via a second through electrode 34b that penetrates through the base 31 in the Y' axis direction.

The first electrode pad 33a and the second electrode pad 33b may instead be respectively electrically connected to the first outer electrode 35a and the second outer electrode 35b via side surface electrodes provided on side surfaces of the base 31 connecting the upper surface 31A and the lower surface 31B to each other. The first to fourth outer electrodes 35a to 35d may instead be castellated electrodes that are provided in a recessed manner in the side surfaces of the base 31.

The base member 30 includes a first electrically conductive holding member 36a and a second electrically conductive holding member 36b, which form a pair of electrically conductive holding members. The first electrically conductive holding member 36a and the second electrically conductive holding member 36b are used to mount the crystal vibration element 10 on the base member 30 and electrically connect the crystal vibration element 10 and the base member 30 to each other. The first electrically conductive holding member 36a is bonded to the first electrode pad 33a and the first connection electrode 16a and electrically connects the first electrode pad 33a and the first connection electrode 16a to each other. The second electrically conductive holding member 36b is bonded to the second electrode pad 33b and the second connection electrode 16b and electrically connects the second electrode pad 33b and the second connection electrode 16b to each other. The first electrically conductive holding member 36a and the second electrically conductive holding member 36b hold the crystal vibration element 10 at a certain distance from the base member 30 so that the excitation part 17 can be excited.

The first electrically conductive holding member 36a and the second electrically conductive holding member 36b consist of a cured electrically conductive adhesive such as a thermosetting resin or a light-curable resin, and the main component of the first electrically conductive holding member 36a and the second electrically conductive holding member 36b is, for example, silicone resin. The first electrically conductive holding member 36a and the second electrically conductive holding member 36b contain electrically conductive particles and, for example, metal particles containing silver (Ag) are used as the electrically conductive particles. The first electrically conductive holding member 36a bonds the first electrode pad 33a and the first connection electrode 16a to each other and the second electrically conductive holding member 36b bonds the second electrode pad 33b and the second connection electrode 16b to each other.

The main component of the first electrically conductive holding member 36a and the second electrically conductive holding member 36b is not limited to silicone resin so long as the main component is a curable resin, and for example, the main component may be epoxy resin or acrylic resin. In addition, the way in which electrical conductivity is imparted to the first electrically conductive holding member 36a and the second electrically conductive holding member 36b is not limited to the use of silver particles, and electrically conductivity may alternatively be imparted by using other metals, electrically conductive ceramics, electrically conductive organic materials, and so on. The main component of the first electrically conductive holding member 36a and the second electrically conductive holding member 36b may be an electrically conductive polymer.

The resin composition of the first electrically conductive holding member 36a and the second electrically conductive holding member 36b may contain appropriately chosen additives. The additives may be, for example, adhesion-imparting agents, fillers, thickeners, sensitizers, anti-aging agents, defoamers, and so on for improving the workability and preservability of the electrically conductive adhesives. In addition, a filler may be added for the purpose of increasing the strength of the cured material or for helping to maintain the distance between the base member 30 and the crystal vibration element 10.

Next, the cover member 40 will be described.

The cover member 40 is bonded to the base member 30 and forms an internal space 49 in which the crystal vibration element 10 is accommodated between the cover member 40 and the base member 30. The material of the cover member 40 is not particularly limited, and for example, the cover member 40 may be formed of an electrically conductive material such as a metal. The cover member 40 is given an electromagnetic shielding function for reducing the entry and exit of electromagnetic waves into and out of the internal space 49 by forming the cover member 40 of an electrically conductive material.

The cover member 40 has a planar top surface part 41 and a side wall part 42 that is connected to the outer periphery of the top surface part 41 and extends in a direction that intersects the main surfaces of the top surface part 41. The planar shape of the top surface part 41 in a plan view in a direction perpendicular to the main surfaces thereof is, for example, a rectangular shape. The top surface part 41 faces the base member 30 with the crystal vibration element 10 interposed therebetween and the side wall part 42 surrounds the periphery of the crystal vibration element 10 in directions parallel to the XZ' plane. The leading end of the side wall part 42 extends in a frame-like shape on the side nearer to the base member 30 than to the crystal vibration element 10.

The cover member 40 may be formed of a ceramic material, a semiconductor material, a resin material, or the like. In addition, the planar shape of the top surface part 41 may instead be a polygonal shape, a circular shape, an elliptical shape, or a combination of these shapes.

Next, the bonding member 50 will be described.

The bonding member 50 is provided along the entire outer peripheries of the base member 30 and the cover member 40 and has a rectangular frame-like shape. When the upper surface 31A of the base member 30 is seen in a plan view, the first electrode pad 33a and the second electrode pad 33b are disposed inside from the bonding member 50 and the bonding member 50 is provided so as to surround the crystal vibration element 10. The bonding member 50 bonds the leading end of the side wall part 42 of the cover member 40 and the upper surface 31A of the base 31 of the base member 30 to each other and seals the internal space 49. The bonding member 50 desirably has a high gas barrier property, and more desirably has low moisture permeability. The bonding member 50 is, for example, a cured adhesive having epoxy resin as a main component. The resin-based adhesive forming the bonding member 50 may, for example, include a vinyl compound, an acrylic compound, a urethane compound, a silicone compound, and so on.

Note that the bonding member 50 is not limited to having a frame shape that is continuous along the peripheral direction and may instead be provided in a discontinuous manner along the peripheral direction. The bonding member 50 may be formed of a cured silicon-based adhesive containing water glass or the like, a cured calcium-based adhesive containing cement or the like, or a Au—Sn alloy based metallic solder. When the bonding member 50 is formed of metallic solder, a metallization layer may be provided on the base member 30 in order to improve the adhesion between the base member 30 and the bonding member 50. The bonding member 50 may include a cured resin-based adhesive and a coating that has lower moisture permeability than the cured resin-based adhesive.

Figure 3:
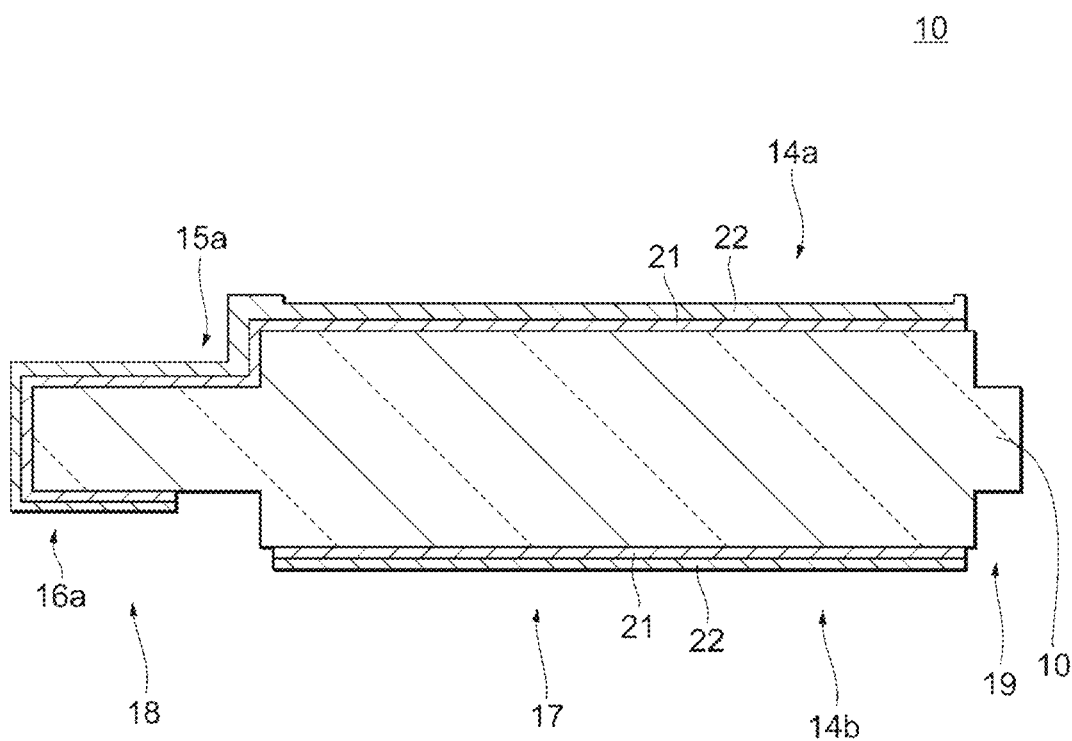
FIG. 3 is a sectional view schematically illustrating the configuration of the electrodes of a crystal vibration element.
Figure 4:
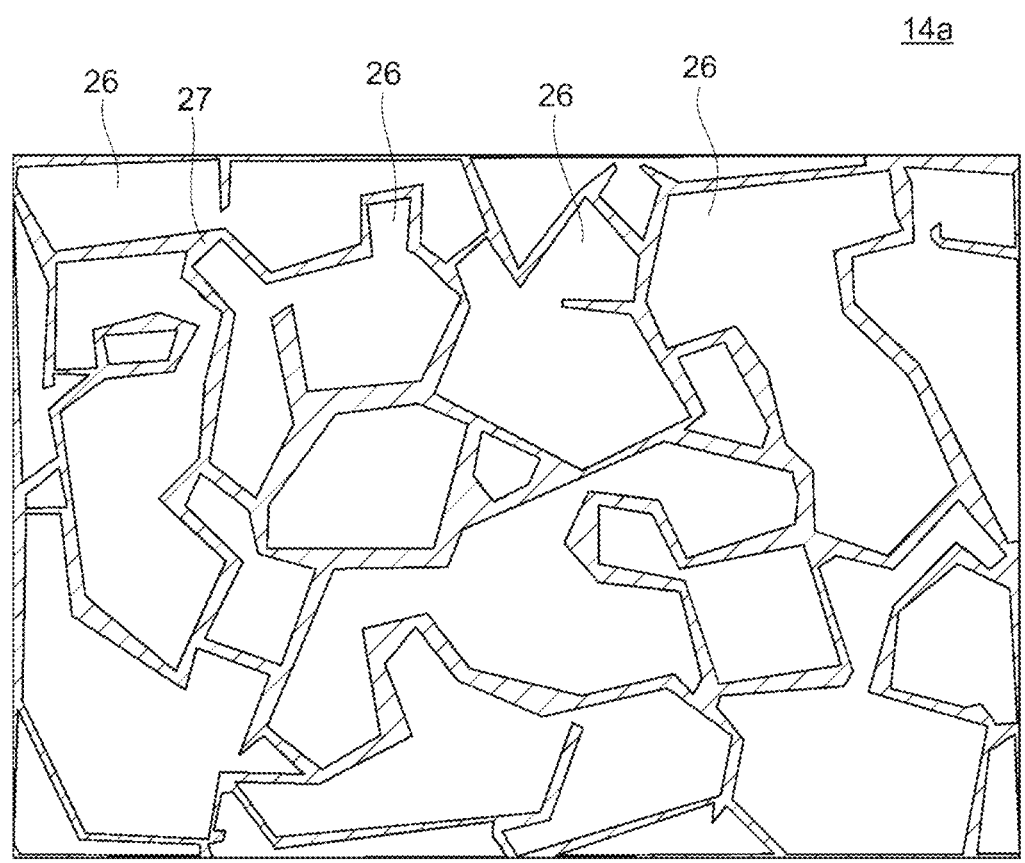
FIG. 4 is a plan view schematically illustrating the configuration of a surface of a center part of a first excitation electrode.
Figure 5:
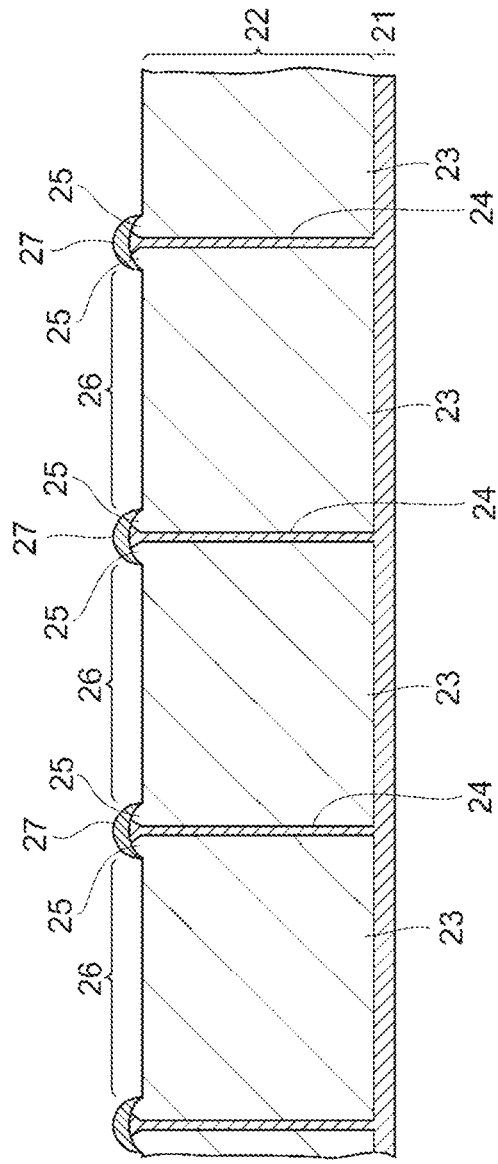
FIG. 5 is a sectional view schematically illustrating the configuration of the center part of the first excitation electrode.

Next, the configuration of the electrodes of the crystal vibration element 10 will be described in more detail while referring to FIGS. 3 to 5. FIG. 3 is a sectional view schematically illustrating the configuration of the electrodes of the crystal vibration element. FIG. 4 is a plan view schematically illustrating the configuration of the surface of a center part of the first excitation electrode. FIG. 5 is a sectional view schematically illustrating the configuration of the center part of the first excitation electrode.

The crystal vibration element 10 has a pair of electrodes. In the example illustrated in FIG. 3, one electrode, out of the pair of electrodes, includes the first excitation electrode 14a, the first lead-out electrode 15a, and the first connection electrode 16a and the other electrode, out of the pair of electrodes, includes the second excitation electrode 14b, the second lead-out electrode 15b, and the second connection electrode 16b. In each set, the excitation electrode, the lead-out electrode, and the connection electrode are connected to each other in a continuous manner. In this case, the excitation electrode, the lead-out electrode, and the connection electrode may be formed so as to be integrated with each other. In the example illustrated in FIG. 3, the electrodes constituting the pair of electrodes of the crystal vibration element 10 have lower layers 21 and upper layers 22.

The lower layers 21 contact the crystal piece 11 and are provided between the crystal piece 11 and the upper layers 22. The lower layers 21 are formed of a material having higher adhesion to the crystal piece 11 than the material of the upper layers 22 and contain chromium (Cr) as a main component. The lower layers 21 are, for example, chromium films deposited on the surfaces of the crystal piece 11 using a sputtering method.

The upper layers 22 are provided on the opposite sides of the lower layers 21 from the sides where the crystal vibration element 10 is located. For example, the thicknesses of upper layers 22 is larger than the thicknesses of the lower layers 21. The upper layers 22 are formed of a material having a higher chemical stability than the material of the lower layers 21 and contain gold (Au) as a main component. The upper layers 22 are, for example, gold films deposited on the surfaces of the lower layers 21 using a sputtering method. For example, as illustrated in FIG. 3, the thickness of the upper layer 22 of the first excitation electrode 14a is larger than the thickness of the upper layer 22 of the second excitation electrode 14b. In addition, the center part of the upper layer 22 of the first excitation electrode 14a in the XZ' plane is ground down more than the periphery of the upper layer 22 by performing ion milling in order to realize frequency adjustment, which will be described later. In other words, a recess is formed in the center part of the surface of the first excitation electrode 14a in the XZ' plane. The thickness of the upper layer 22 of the first excitation electrode 14a may instead be made uniform by increasing the area subjected to ion milling.

Here, if a chromium oxide film is formed on the upper layer of the excitation electrode as described in Patent Document 1, the oxidation will not proceed any further, and the frequency should not fluctuate. However, in reality, the frequency will fluctuate after a heating process that is performed later. Therefore, the inventors focused on the chromium compound present at the surface of the upper layer 22 of the first excitation electrode 14a. When image analysis was performed on the surface of the upper layer 22 using a field emission-scanning electron microscope (FE-SEM), as illustrated in FIG. 4, surface parts 26 of a plurality of crystal grains 23 composed of gold were exposed at the surface of the upper layer 22 and a chromium compound 27 surrounded the peripheries of these surface parts 26 in a web-like pattern.

In more detail, as illustrated in FIG. 5, the upper layer 22 consists of a polycrystalline material in which a plurality of crystal grains 23 aggregate together. Grain boundaries 24 between the plurality of crystal grains 23 act as diffusion pathways for chromium that has diffused from the lower layer 21. The plurality of crystal grains 23 include boundary parts 25 located near the grain boundaries 24 and the surface parts 26 surrounded by the boundary parts 25. The boundary parts 25 are raised above the surface parts 26 in the first excitation electrode 14a. In addition, the boundary parts 25 are covered by the chromium compound 27. Therefore, as illustrated in FIG. 4, the surface of the first excitation electrode 14a consists of the web-shaped chromium compound 27 and the surface parts 26 of the plurality of crystal grains 23 surrounded by the chromium compound 27. The chromium compound 27 is chromium oxide or chromium oxide hydrate, resulting from chromium in the lower layer 21 diffusing along the grain boundaries of the upper layer 22 and becoming oxidized at the surface of the upper layer 22.

The inventors hypothesized that frequency fluctuations in the subsequent heating process was caused by newly diffused chromium from the grain boundaries 24 lifting up the chromium compound 27 and the chromium exposed near the boundary parts 25 becoming oxidized. Since the grain boundaries 24 act as diffusion pathways for the chromium, it is desirable that each of the plurality of crystal grains 23 have a large grain size in order to inhibit diffusion of chromium and formation of the chromium compound 27. In other words, if the grain sizes of the plurality of crystal grains 23 are large, the grain boundaries 24 become narrower and diffusion of chromium can be suppressed.

More specifically, diffusion of chromium can be suppressed when the area percentage of the plurality of crystal grains 23 is equal to or more than 35% and equal to or less than 60%. Here, as illustrated in FIG. 4, when the surface of the first excitation electrode 14a is seen in a plan view in a downward direction, since the boundary parts 25 between the plurality of crystal grains 23 are covered by the chromium compound 27, the surface area of the plurality of crystal grains 23 in the surface of the first excitation electrode 14a is the sum of the areas of the plurality of surface parts 26. In other words, when the surface of the first excitation electrode 14a is seen in the plan view, in a certain unit area, $Rau=Sa/(Sa+Sc)$ and $0.4 \leq Rau \leq 0.6$ are satisfied, where Sa is the sum of the areas of the plurality of surface parts 26, Sc is the area of the chromium compound 27, and Rau is the area percentage of the plurality of crystal grains 23. Sa and Sc are calculated by analyzing an 800×1200 pixel image obtained by capturing, at a magnification of 50000 times, a region in the vicinity of the center of the surface of the first excitation electrode 14a using an FE-SEM. One pixel corresponds to an area of 1.984375 $nm^2$, and therefore Sa or Sc can be calculated by multiplying this area by the number pixels included in the image of the surface parts 26 or the boundary parts 25.

The average area of the crystal grains 23 at a cumulative frequency of 50% is desirably greater than or equal to 1200 $nm^2$. In other words, it is desirable that an average area Sp50 of the surface parts 26 at a cumulative frequency of 50% satisfy $1200 \ nm^2 \leq Sp50$.

It is further desirable that the average area of the crystal grains 23 at a cumulative frequency of 80% be greater than or equal to 4400 $nm^2$. In other words, it is desirable that an average area Sp80 of the surface parts 26 at a cumulative frequency of 80% satisfy $4400 \ nm^2 \leq Sp80$.

In the surface of the first excitation electrode 14a, it is desirable that the composition ratio of chromium atoms to gold atoms (Cr/Au) be less than 0.38. The atomic composition ratio is, for example, obtained X-ray photoelectron spectroscopy quantitative analysis.

Figure 6:
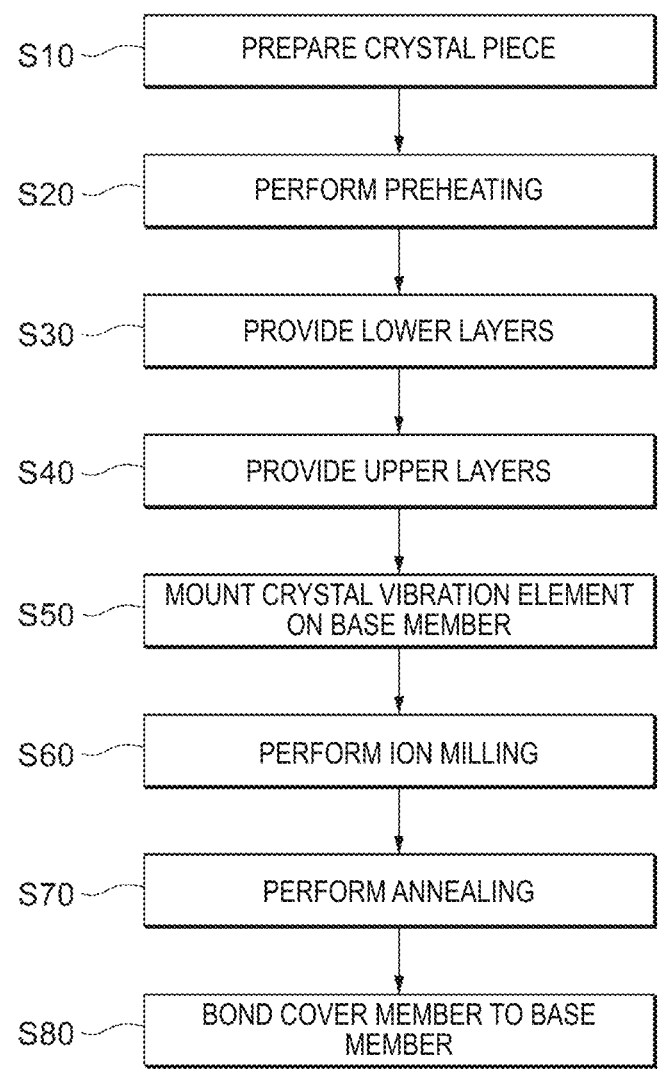
FIG. 6 is a flowchart schematically illustrating a method of manufacturing the crystal vibrator according to the First Embodiment.
Figure 7:
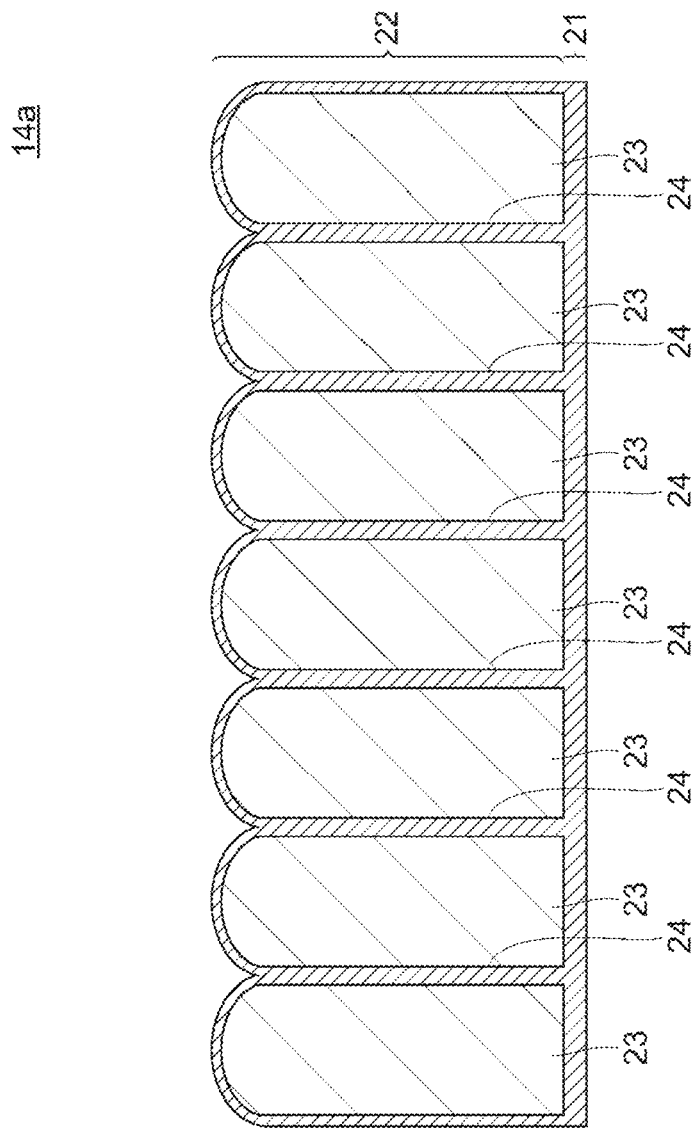
FIG. 7 is a sectional view schematically illustrating the first excitation electrode prior to performance of ion milling.
Figure 8:
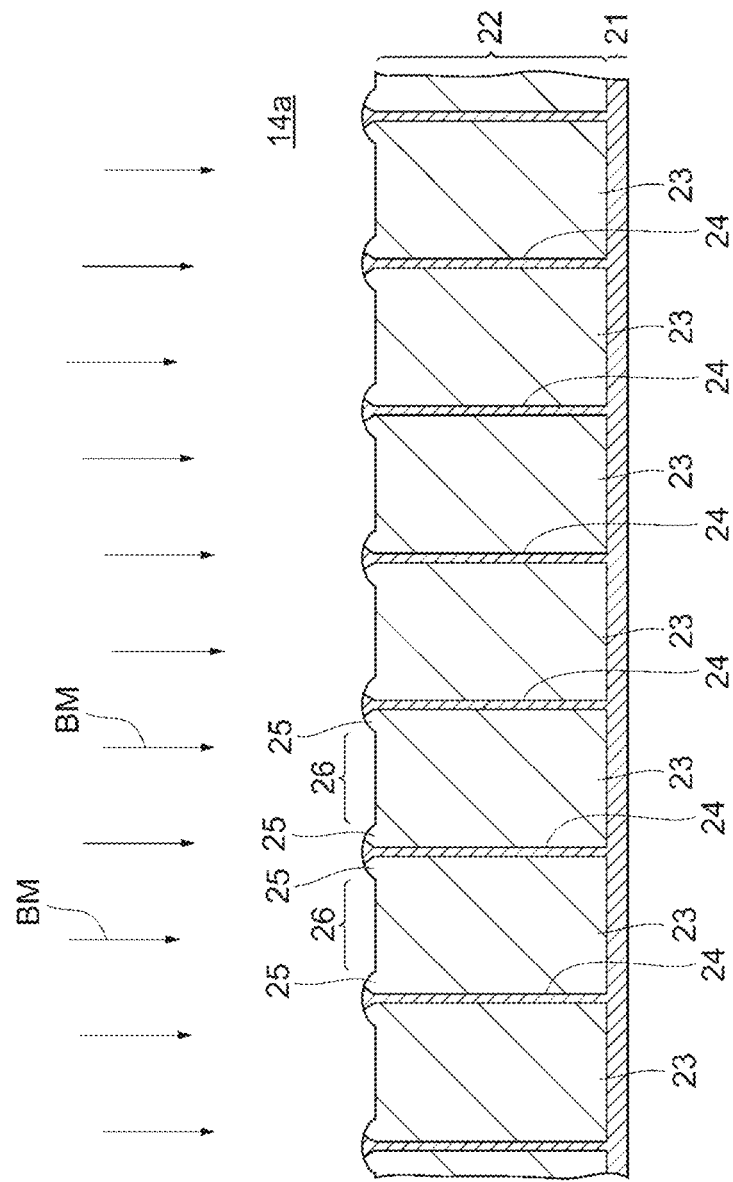
FIG. 8 is a sectional view schematically illustrating changes in the first excitation electrode caused by ion milling.
Figure 9:
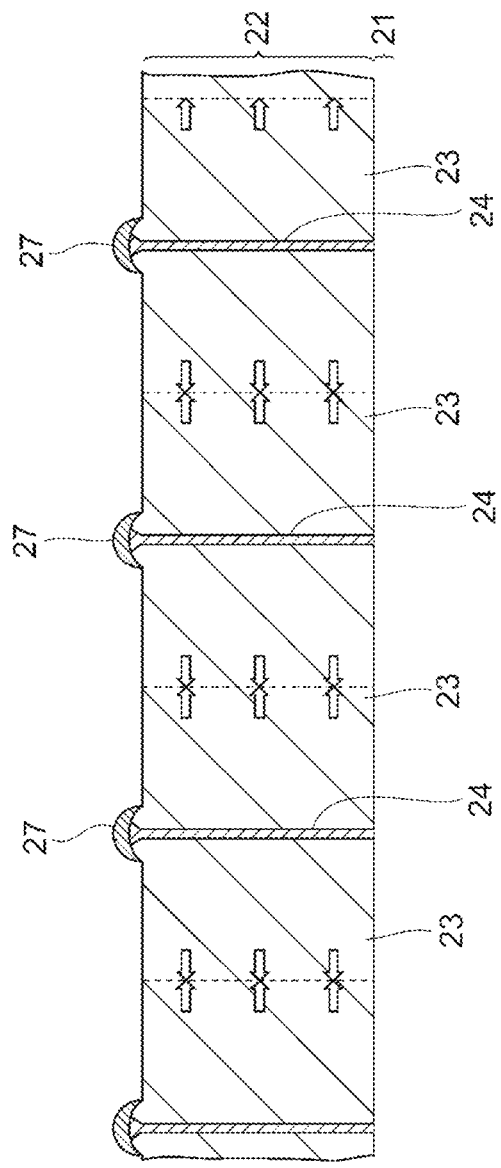
FIG. 9 is a sectional view schematically illustrating changes in the first excitation electrode caused by annealing.

Next, a method of manufacturing the crystal vibrator 1 will be described while referring to FIGS. 6 to 9. FIG. 6 is a flowchart schematically illustrating a method of manufacturing the crystal vibrator according to the First Embodiment. FIG. 7 is a sectional view schematically illustrating the first excitation electrode prior to performance of ion milling. FIG. 8 is a sectional view schematically illustrating changes in the first excitation electrode caused by ion milling. FIG. 9 is a sectional view schematically illustrating changes in the first excitation electrode caused by annealing.

First, a crystal piece is prepared (S10).

In this step, a crystal substrate is cut from a synthetic crystal so that the main surfaces thereof extend along the XZ' plane, and parts of the crystal substrate are removed by performing wet etching using a photolithography method in order to form the outline of the crystal piece 11 when the XZ' plane is seen in a plan view. Next, a double-sided mesa structure is formed by partially removing parts of the crystal piece 11 that correspond to the peripheral parts 18 and 19 by performing wet etching. The method of manufacturing the crystal piece 11 is not limited to wet etching. The crystal piece 11 may be formed by cutting the crystal substrate into individual crystal pieces 11 by using a dicing machine and a beveling process may be performed on the resulting individual crystal pieces 11.

Next, the pair of electrodes, which includes electrodes that face each other, are provided so that the crystal piece 11 is interposed therebetween using a sputtering method such as a magnetron sputtering method. This step includes a Step S20 of performing preheating, a Step S30 of depositing the lower layers 21, and a Step S40 of depositing the upper layers 22.

As a result of diligent study, the inventors found that not only the deposition temperature but also control of the temperature during the preheating is important for increasing the average grain size of the crystal grains 23 in the upper layers 22. In other words, in Step S20 of performing the preheating, the crystal piece 11 needs to be heated in a temperature in a range of equal to or higher than 100° C. and equal to or lower than 300° C. If the temperature of the crystal piece 11 is lower than 100° C., the average grain size of the crystal grains 23 of the upper layers 22 becomes smaller and diffusion of chromium progresses more readily. The crystal grains cannot be sufficiently grown even in grain growth by annealing, which will be described later. If the temperature of the crystal piece 11 is higher than 300° C., chromium diffusion overcomes the suppression of chromium diffusion by grain growth, and the amount of chromium that rises from the surface of the excitation electrode increases. If Step S30 of providing the lower layers 21 and Step S40 of providing the upper layers 22 are carried out using pattern deposition using a metal mask, it is difficult to raise the temperature of the crystal piece 11 in the deposition chamber due to the large heat capacity of the metal mask. Therefore, the preheating is performed in a chamber prior to the deposition chamber.

Step S30 of providing the lower layers 21 and Step S40 of providing the upper layers 22 are carried out by performing pattern deposition using a metal mask with a sputtering method. In Step S30, using chromium as a sputtering target, chromium is deposited on the surfaces of the preheated crystal piece 11 to form the lower layers 21 of the electrode patterns. The thickness of the lower layers 21 is 5 nm, for example. In Step S40, the upper layers 22 of the electrode patterns are formed by depositing gold on the surfaces on the lower layers 21 using gold as the sputtering target. As illustrated in FIG. 7, the plurality of crystal grains 23 grow in columnar shapes from the lower layers 21. Chromium diffuses along the grain boundaries 24 and the surfaces of the crystal grains 23. At this time, the thickness of the upper layer 22 on the upper surface 11A side of the crystal piece 11 is, for example, 140 nm. In order to increase the margin by which the frequency may be adjusted using ion milling, which will be described later, the upper layers 22 are provided so that the thickness of the upper layer 22 on the upper surface 11A side of the crystal piece 11 is larger than the thickness of the upper layer 22 on the lower surface 11B side of the crystal piece 11.

The preheating may be performed in the deposition chamber, and may be performed during the deposition of at least one out of the lower layers 21 and the upper layers 22 or between the deposition of the lower layers 21 and the deposition of the upper layers 22. The step of providing the electrodes on the surfaces of the crystal piece 11 is not limited to pattern deposition. After depositing the lower layers 21 and the upper layers 22 over the entire surfaces of the crystal piece 11, parts of the lower layers 21 and the upper layers 22 may be removed by etching in order to form the electrode patterns. The method of depositing the lower layers 21 and the upper layers 22 is not limited to a sputtering method and the method may be appropriately selected from among various vapor deposition methods such as physical vapor deposition (PVD) and chemical vapor deposition (CVD). Furthermore, the lower layers 21 and the upper layers 22 may be deposited using a deposition method other than a vapor phase growth method such as a printing method or a plating method.

Next, the crystal vibration element 10 is mounted on the base member 30 (S50).

First, a paste-like resin composition, which is the material for forming the first electrically conductive holding member 36a and the second electrically conductive holding member 36b, is applied onto the first and second electrode pads 33a and 33b of the base member 30. Next, the crystal vibration element 10 is placed on the resin composition and the first electrically conductive holding member 36a and the second electrically conductive holding member 36b are formed by curing the resin composition. The resin composition of the first electrically conductive holding member 36a and the second electrically conductive holding member 36b may be applied to the crystal vibration element 10 in advance.

Next, ion milling is performed (S60).

As illustrated in FIG. 8, at least part of the surface of the first excitation electrode 14a is irradiated with an ion beam BM in order to remove part of the upper layer 22. In this way, the frequency of the crystal vibration element 10 is adjusted by changing the mass of the excitation part 17 of the crystal vibration element 10. In other words, Step S60 corresponds to a frequency adjustment step. The first excitation electrode 14a is removed while monitoring the frequency by applying a voltage to the first excitation electrode 14a and the second excitation electrode 14b in order to gradually increase the frequency to the target frequency.

The speed at which gold is removed by the ion beam BM is higher than the speed at which chromium is removed. Therefore, at the end of Step S60, the boundary parts 25 are raised up from the surface parts 26 due to the effect of the chromium that has diffused along the grain boundaries 24.

Next, annealing is performed (S70).

The annealing temperature is, for example, 200° C. Lattice defects created in the plurality of crystal grains 23 by the ion milling are reduced by performing annealing and the plurality of crystal grains 23 are recrystallized. In addition, adjacent crystal grains 23 fuse together as a result of the recrystallized plurality of crystal grains 23 undergoing grain growth or as illustrated in FIG. 9. As a result, the grain size of each of the plurality of crystal grains 23 is increased and the number of grains per unit area of the plurality of crystal grains 23 is decreased. As a result, the first excitation electrode 14a is obtained in which the area percentage of the plurality of crystal grains 23 in the surface is greater than or equal to 35%.

(Evaluation of Frequency Stability and Surface Structure)

Next, the results of evaluating the effect of preheating on frequency stability and changes in surface structure will be described. The frequency deviation of the crystal vibration element 10, which was encapsulated by bonding the cover member 40 to the base member 30, was measured for samples not subjected to preheating, samples preheated to 100° C., samples preheated to 200° C., and samples preheated to 250° C. Similarly, the surface of the first excitation electrode 14a after annealing and before encapsulation under different conditions of preheating was subjected to image analysis using an FE-SEM and composition analysis using an XPS.

Figure 10:
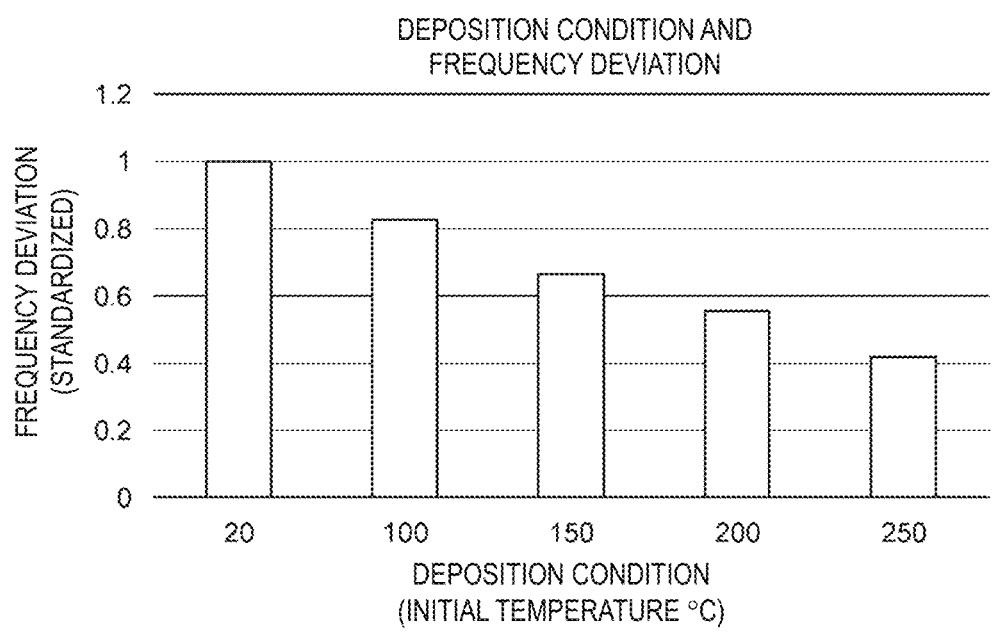
FIG. 10 illustrates a graph depicting the relationship between frequency deviation after encapsulation and a deposition condition.

FIG. 10 illustrates a graph depicting the relationship between frequency deviation after encapsulation and a deposition condition. The horizontal axis represents the temperature of the crystal piece immediately before deposition of the excitation electrodes (hereafter, referred to as "initial temperature") and the vertical axis represents the standardized frequency deviation. The initial temperature of 20° C. is the manufacturing condition where preheating has not been performed (hereafter, referred to as "without preheating") and the initial temperatures of 100° C., 150° C., 200° C., and 250° C. correspond to the preheating temperatures (hereafter, referred to as "preheating temperatures"). Ten crystal vibrators having had their frequency adjusted to 40 kHz before encapsulation were prepared under each manufacturing condition. After encapsulation, the crystal vibrators were left in an environment of 25° C.±1° C. and 30-60 RH % for 24 hours, and then the frequencies were measured to obtain the deviations. The frequency deviations were standardized with the frequency deviation of the crystal vibrator having an initial temperature of 20° C. taken as 1. In other words, the frequency deviations of the crystal vibrators having the respective initial temperatures were divided by the frequency deviation of the crystal unit having an initial temperature of 20° C. and the obtained values where plotted as the vertical axis. The frequency deviations for the initial temperatures of 100° C., 150° C., 200° C., and 250° C. are improved compared to the frequency deviation for the initial temperature of 20° C. In other words, compared to the frequency deviation in the case without preheating, the frequency deviation for the preheating temperature of 100° C. is improved to around 80%, the frequency deviation for the preheating temperature of 150° C. is improved to around 65%, the frequency deviation for the preheating temperature of 200° C. is improved to around 60%, and the frequency deviation for the preheating temperature of 250° C. is improved to around 40%. This is thought to be because diffusion of chromium is suppressed due to the grain boundaries of the gold of the upper layer being reduced and changes in the mass of the first excitation electrode caused by oxidation of the diffused chromium is reduced.

Figure 11:
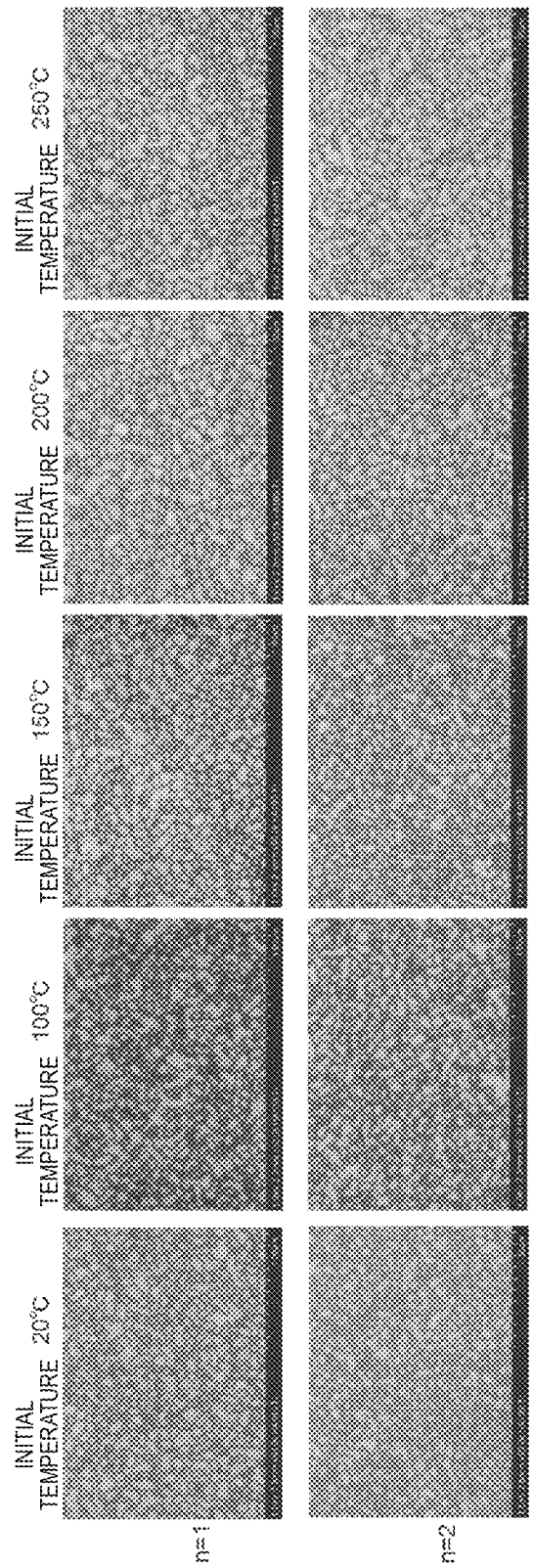
FIG. 11 is a diagram illustrating an FE-SEM image capturing the surface of the first excitation electrode.

FIG. 11 is a diagram illustrating an FE-SEM image capturing the surface of the first excitation electrode. FIG. 11 illustrates FE-SEM images of two samples manufactured for each of deposition conditions in which the initial temperatures were 20° C., 100° C., 150° C., 200° C., and 250° C. The FE-SEM images were captured at a magnification of 50000 times at the center and near an edge of the first excitation electrode. In this case, the illustrated 800×1200 pixel images each correspond to an area of 1.6 μm×2.4 μm=3.744 μm².

In each image, the light regions indicate gold and the dark regions indicate the chromium compound. It can be seen that as the temperature used in the preheating increases, the light regions increase and the areas of the individual light regions surrounded by the dark regions increase. The light regions indicating gold and the dark regions indicating the chromium compound were quantified by performing image analysis in order to facilitate quantitative evaluation and the obtained results will be described next.

FIG. 12 is a table illustrating the area percentages of a plurality of crystal grains. FIG. 12 illustrates the area percentages (%) of a plurality of crystal grains obtained by analyzing FE-SEM images of samples manufactured using deposition conditions in which the initial temperatures were 20° C., 100° C., 150° C., 200° C., and 250° C. In other words, the area percentage column illustrates the area percentage of gold occupying the surface of the first excitation electrode for each initial temperature and the average column illustrates the average of the area percentages of gold calculated for the plurality of samples. In FIG. 12, the term "area percentage" refers to, for example, the percentage constituted by light regions in the images in FIG. 11, and was calculated by multiplying the number of grains constituting the plurality of crystal grains composed of gold (the number of light regions surrounded by dark regions) per unit area in FIG. 11 by the average area of the crystal grains and dividing the result by the unit area. The number of samples for each initial temperature of 20° C. and 100° C. was two, and the number of samples for each initial temperatures of 150° C., 200° C., and 250° C. was four.

In the case of an initial temperature of 20° C., the area percentages of gold were 30.2% and 32.2%, which is less than 35% in both cases, and the average value was 31.2%. In addition, the area percentages increased as the initial temperature increased. Specifically, the area percentages in the case of an initial temperature of 100° C. were 38.6% and 42.3%, giving an average value of 40.5%. The area percentages in the case of an initial temperature of 150° C. were 42.1%, 43.2%, 46.9%, and 46.4%, giving an average value of 44.7%. The area percentages in the case of an initial temperature of 200° C. were 42.6%, 43.6%, 46.9%, and 47.4%, giving an average value of 45.1%. The area percentages in the case of an initial temperature of 250° C. were 47.2%, 44.6%, 45.7%, and 45.7%, giving an average value of 45.8%. In other words, as illustrated in FIG. 10, at the preheating temperature of 100° C. where the frequency deviation was improved, the area percentage of gold in each sample was at least greater than or equal to 35% and the average area percentage was at least 40%. At the preheating temperature of 150° C. where the frequency deviation was further improved, the area percentage of gold in each sample was at least 42% and the average area percentage was at least 44%. At the preheating temperature of 200° C. where the frequency deviation was further improved, the area percentage of gold in each sample was at least 42% and the average area percentage was at least 45%. At the preheating temperature of 250° C. where the frequency deviation was further improved, the area percentage of gold in each sample was at least 44% and the average area percentage was at least 45%.

Figure 13:
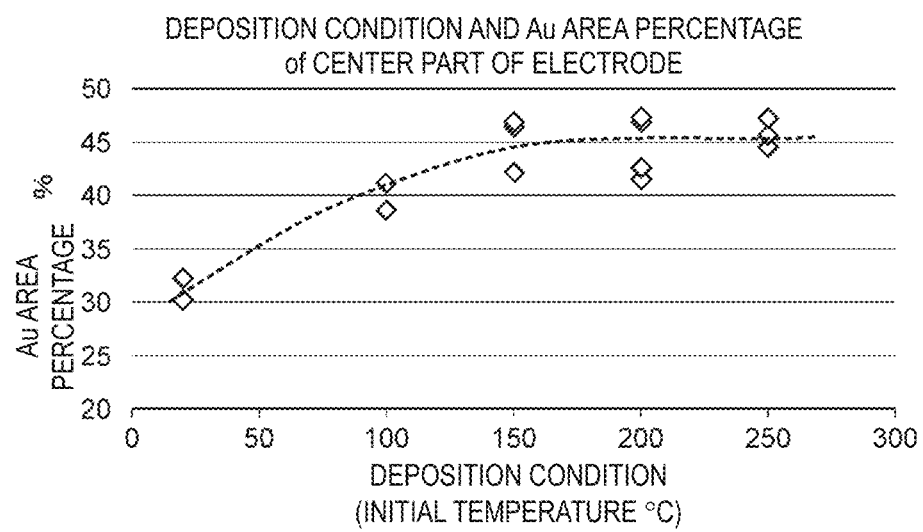
FIG. 13 illustrates a graph depicting the relationship between the area percentages of a plurality of crystal grains in the surface of the first excitation electrode and a deposition condition.

FIG. 13 illustrates a graph depicting the relationship between the area percentages of gold in the surface of the first excitation electrode and deposition conditions. In FIG. 13, the horizontal axis represents deposition conditions (initial temperature) and the vertical axis represents the area percentages of a plurality of crystal grains in a region of the first excitation electrode in which ion milling has been performed, i.e., the area percentage of gold (Au area percentage). As the initial temperature rises, the area percentage of gold rises, and variations become smaller. The area percentage of gold was around 30% for an initial temperature of 20° C., and increased to around 40% for an initial temperature of 100° C. and to around 45% for an initial temperature of 150° C. The rate of increase of the area percentage of gold with respect to the increase in the initial temperature changes around 150° C. Specifically, the rate of increase of the area percentage of gold at initial temperatures equal to or higher than 150° C. and equal to or lower than 250° C. is smaller than the rate of increase of the area percentage of gold at initial temperatures equal to or higher than 20° C. and lower than 150° C. This is assumed to be due to the crystal growth of gold having progressed sufficiently at preheating temperatures of 150° C. and above. For this reason, it is desirable that the preheating temperature be greater than or equal to 100° C. and even more desirably be greater than or equal to 150° C.

FIG. 14 illustrates a table detailing the atomic composition of the surface of the first excitation electrode. FIG. 14 illustrates the atomic compositions of the surfaces of two samples manufacturing using deposition conditions in which the initial temperatures were set to 20° C., 100° C., 200° C., and 250° C. as determined by XPS quantitative analysis (equipment used: PHI5000 VersaProbe III manufactured by ULVAC-PHI, irradiated X-rays: Alka radiation). In FIG. 14, "C" indicates the abundance ratio of carbon atoms, "O" indicates the abundance ratio of oxygen atoms, "Si" indicates the abundance ratio of silicon atoms, "Cr" indicates the abundance ratio of chromium atoms, and "Au" indicates the abundance ratio of gold atoms in units of atomic %. Furthermore, "Cr/Au" indicates the ratio of the abundance ratio Cr atoms to the abundance ratio of Au atoms.

As the initial temperature increases, "Cr" decreases, "Au" increases, and "Cr/Au" decreases. For the initial temperature of 20° C. (without preheating), "Cr/Au" was 0.55 and 0.63. For the initial temperature of 100° C., "Cr/Au" was 0.40 and 0.38. For the initial temperature of 200° C., "Cr/Au" was 0.35 and 0.32. For the initial temperature of 250° C., "Cr/Au" was 0.31 and 0.31. Therefore, from the viewpoint of reducing the frequency deviation, "Cr/Au" is desirably 0.40 or less, more desirably 0.35 or less, and still more desirably 0.31 or less.

Figure 15:
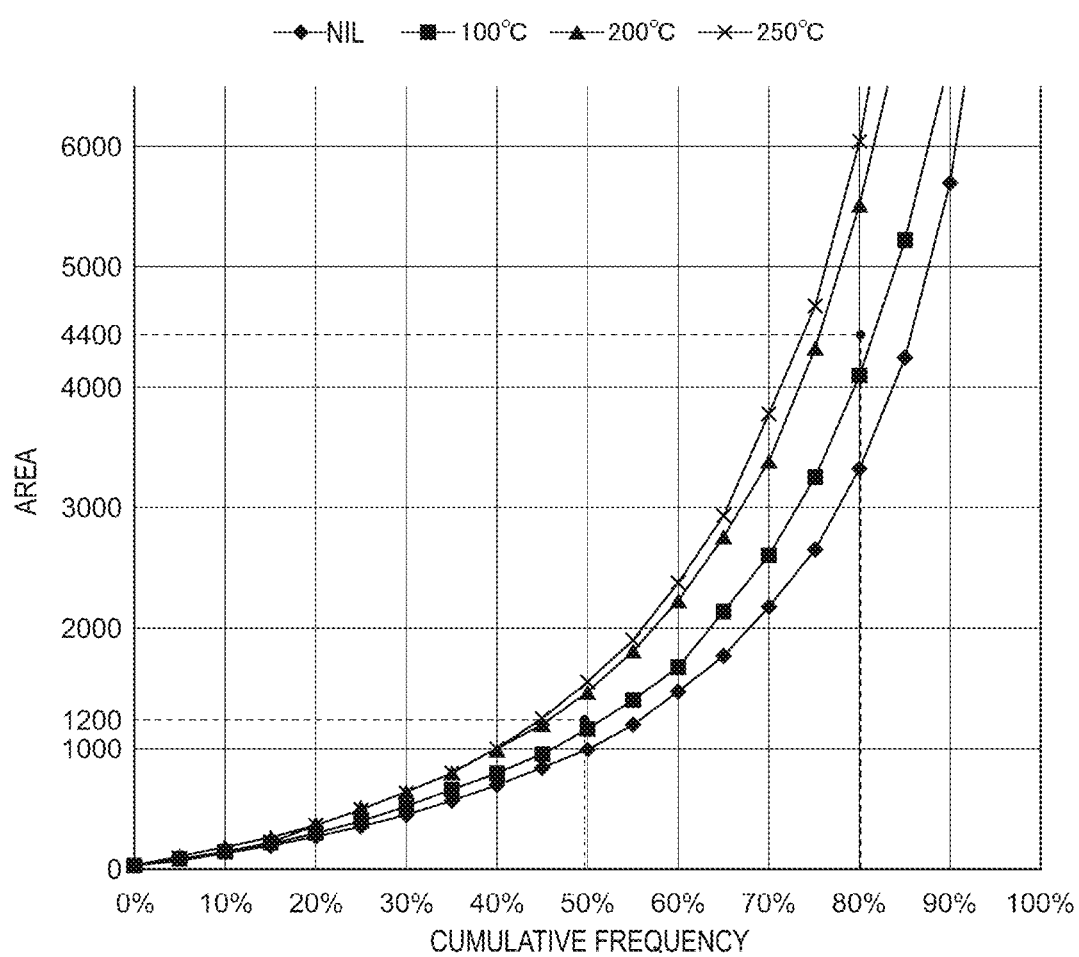
FIG. 15 illustrates a graph depicting the relationship between cumulative frequency and area for a plurality of crystal grains in the surface of the first excitation electrode.

FIG. 15 illustrates a graph depicting the relationship between cumulative frequency and area for a plurality of crystal grains in the surface of the first excitation electrode. The horizontal axis represents cumulative frequency for the surface parts 26 and the vertical axis represents the areas of the surface parts 26 for the respective cumulative frequencies. The evaluation results for the samples without preheating are plotted as diamonds, the evaluation results for the samples preheated to an initial temperature of 100° C. are plotted as squares, the evaluation results for the samples preheated to an initial temperature of 200° C. are plotted as triangles, and the evaluation results for the samples preheated to an initial temperature of 250° C. are plotted as crosses. An area Sp50 of the surface areas 26 at a cumulative frequency of 50% increases as the temperature of preheating increases, and the amount of change in Sp50 (Sp50/$\Delta$T) with respect to temperature change ($\Delta$T) becomes smaller as the temperature of preheating increases. The same is true for an area Sp80 of the surface parts 26 at a cumulative frequency of 80%. Reduction of frequency deviation was confirmed in samples satisfying at least one out of Sp50$\geq$1200 and Sp80$\geq$4400.

Hereafter, some or all of the embodiments of the present invention are listed and their effects are described. However, the present invention is not limited to the following embodiments.

According to an aspect of the present invention, when the area percentage of the plurality of crystal grains is greater than or equal to 35%, the exposure of chromium resulting from diffusion can be suppressed, and therefore frequency fluctuations after encapsulation are reduced. Therefore, deviations in the initial frequency are reduced and a crystal vibrator having improved frequency stability can be provided. In addition, changes in the mass of the excitation electrode can be suppressed even in a high humidity environment, and as a result, changes in frequency over time are reduced. If the temperature of preheating is increased in order to make the area percentage of the plurality of crystal grains greater than 60%, chromium diffusion will overcome the suppression of chromium diffusion by the growth of the gold grains, and the chromium content of the upper layer will increase. Furthermore, if the area percentage of the plurality of crystal grains is less than or equal to 60%, damage to the electrically conductive holding member and changes in the piezoelectric properties of the crystal piece due to the preheating can be suppressed.

As an aspect, a composition ratio of chromium atoms to gold atoms in the surface of the at least one electrode is preferably less than 0.38.

As an aspect of this embodiment, an average area of the crystal grains at a cumulative frequency of 50% is greater than or equal to 1200 nm$^2$. It is further desirable that an average area of the crystal grains at a cumulative frequency of 80% be greater than or equal to 4400 nm$^2$.

As an aspect, the holder includes a base member that holds the crystal vibration element, a cover member that forms an internal space for accommodating the crystal vibration element between the cover member and the base member, and a bonding member that bonds the base member and the cover member to each other. The bonding member contains a resin material. Although the manufacturing cost is reduced when the holder is encapsulated with a resin material compared to when the holder is encapsulated with a metal material, airtightness is reduced. Therefore, chromium exposed at the surface is oxidized and forms hydrates due to the entry of water vapor, and frequency fluctuations due to changes in the mass of the excitation electrode are likely to occur. However, according to this embodiment, frequency fluctuations can be suppressed even if encapsulation is carried out using a resin material.

As an aspect, in the at least one electrode, the plurality of crystal grains have grain boundary parts that are raised above a surrounding region.

As another aspect of the present invention, a crystal vibrator manufacturing method includes: preparing a crystal vibration element by: preheating a crystal piece at a temperature equal to or higher than 100° C. and equal to or lower than 300° C., providing lower layers containing chromium on opposed surfaces of the preheated crystal piece, and providing upper layers containing gold on the lower layers so as to form a pair of electrodes that face each other with the crystal piece interposed therebetween; mounting the crystal vibration element on a base member using an electrically conductive holding member; and bonding a cover member to the base member using a bonding member.

As an aspect, the method further includes: adjusting a frequency of the crystal vibration element by removing part of an electrode of the pair of electrodes that is on a side of the crystal vibration element opposite to a side facing the base member; and annealing the pair of electrodes.

Embodiments of the present invention are not limited to crystal vibrators and may also be applied to piezoelectric vibrators. An example of a piezoelectric vibrator (piezoelectric resonator unit) is a crystal vibrator (quartz crystal resonator unit) including a crystal vibration element (quartz crystal resonator). The crystal vibration element employs a crystal piece (quartz crystal element) as a piezoelectric piece that is excited using the piezoelectric effect, but the piezoelectric piece may instead be formed of an appropriately chosen piezoelectric material such as a piezoelectric single crystal, a piezoelectric ceramic, a piezoelectric thin film, or a piezoelectric polymer film. For example, lithium niobate (LiNBO$_3$) can be given as an example of a piezoelectric single crystal. Similarly, examples of a piezoelectric ceramic include barium titanate ($BaTiO_3$), lead titanate ($PbTiO_3$), lead zirconate titanate ($Pb(Zr_xTi_{1-x})O_3$; PZT), aluminum nitride (AlN), lithium niobate ($LiNbO_3$), lithium meta-niobate ($LiNb_2O_6$), bismuth titanate ($Bi_4Ti_3O_{12}$), lithium tantalate ($LiTaO_3$), lithium tetraborate ($Li_2B_4O_7$), langasite ($La_3Ga_5SiO_{14}$), and tantalum pentoxide ($Ta_2O_5$). The piezoelectric thin film may be formed by depositing the piezoelectric ceramic on a substrate composed of quartz, sapphire, or the like using a sputtering method, for example. Examples of the piezoelectric polymer film include polylactic acid (PLA), polyvinylidene fluoride (PVDF), and a vinylidene fluoride/trifluoroethylene (VDF/TrFE) copolymer. The various piezoelectric materials given above may be used by being stacked in layers or may be stacked on another member.

Embodiments of the present invention are not particularly limited and can be appropriately applied to any device that performs electromechanical energy conversion using the piezoelectric effect such as timing devices, sound generators, oscillators, and load sensors.

As described above, according to an aspect of the present invention, a piezoelectric vibrator having improved frequency stability and a manufacturing method therefor can be provided.

The purpose of the embodiments described above is to enable easy understanding of the present invention and the embodiments are not to be interpreted as limiting the present invention. The present invention can be modified or improved without departing from the gist of the invention and equivalents to the present invention are also included in the scope of the present invention. In other words, appropriate design changes made to the embodiments by one skilled in the art are included in the scope of the present invention so long as the changes have the characteristics of the present invention. For example, the elements included in the embodiments and the arrangements, materials, conditions, shapes, sizes and so forth of the elements are not limited to those exemplified in the embodiments and can be changed as appropriate. For example, a vibration element and a vibrator of the present invention can be used in timing devices or load sensors. In addition, the elements included in the embodiments can be combined as much as technically possible and such combined elements are also included in the scope of the present invention so long as the combined elements have the characteristics of the present invention.

REFERENCE SIGNS LIST

1 . . . crystal vibrator,
10 . . . crystal vibration element,
11 . . . crystal piece,
14a, 14b . . . excitation electrode,
15a, 15b . . . lead-out electrode,
16a, 16b . . . connection electrode,
21 . . . lower layer,
22 . . . upper layer,
23 . . . crystal grain,
24 . . . grain boundary,
25 . . . boundary part,
26 . . . surface part,
27 . . . chromium compound,
30 . . . base member,
40 . . . cover member,
50 . . . bonding member

The invention claimed is:

1. A piezoelectric vibrator comprising:
a piezoelectric vibration element that includes a piezoelectric piece and a pair of electrodes that face each other with the piezoelectric piece interposed therebetween; and
a holder that accommodates the piezoelectric vibration element,
wherein at least one electrode of the pair of electrodes includes an upper layer containing gold and a lower layer between the piezoelectric piece and the upper layer and contains chromium,
a surface of the at least one electrode contains a plurality of crystal grains composed of gold and a chromium compound along grain boundaries between the plurality of crystal grains, and
an area percentage of the plurality of crystal grains is equal to or more than 35% and equal to or less than 60% when the surface of the at least one electrode is viewed in a plan view thereof.

2. The piezoelectric vibrator according to claim 1, wherein a composition ratio of chromium atoms to gold atoms in the surface of the at least one electrode is less than 0.38.

3. The piezoelectric vibrator according to claim 1, wherein an average area of the crystal grains at a cumulative frequency of 50% is greater than or equal to 1200 $nm^2$.

4. The piezoelectric vibrator according to claim 1, wherein an average area of the crystal grains at a cumulative frequency of 80% is greater than or equal to 4400 $nm^2$.

5. The piezoelectric vibrator according to claim 1, wherein the holder includes a base member that holds the crystal vibration element, a cover member that forms an internal space for accommodating the crystal vibration element between the cover member and the base member, and a bonding member that bonds the base member and the cover member to each other, and the bonding member contains a resin material.

6. The piezoelectric vibrator according to claim 1, wherein in the at least one electrode, the plurality of crystal grains have grain boundary parts that are raised above a surrounding region.

7. The piezoelectric vibrator according to claim 1, wherein the piezoelectric vibration element is a crystal vibration element.

* * * * *